(12) United States Patent
Shim et al.

(10) Patent No.: US 12,059,849 B2
(45) Date of Patent: Aug. 13, 2024

(54) DISPLAY DEVICE AND DISPLAY DEVICE MANUFACTURING METHOD

(71) Applicant: SAMSUNG DISPLAY CO., LTD., Yongin-si (KR)

(72) Inventors: Donghwan Shim, Hwaseong-si (KR); Seungmin Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 304 days.

(21) Appl. No.: 17/437,548

(22) PCT Filed: Nov. 27, 2019

(86) PCT No.: PCT/KR2019/016500
§ 371 (c)(1),
(2) Date: Sep. 9, 2021

(87) PCT Pub. No.: WO2020/209467
PCT Pub. Date: Oct. 15, 2020

(65) Prior Publication Data
US 2022/0143931 A1 May 12, 2022

(30) Foreign Application Priority Data
Apr. 11, 2019 (KR) .................. 10-2019-0042419

(51) Int. Cl.
*B29C 65/72* (2006.01)
*B29C 51/00* (2006.01)
(Continued)

(52) U.S. Cl.
CPC ............ *B29C 65/72* (2013.01); *B29C 51/002* (2013.01); *B29C 51/268* (2013.01);
(Continued)

(58) Field of Classification Search
CPC ....... B29C 51/002; B29C 51/10; B29C 51/16; B29C 51/268; B29C 51/421; B29C 65/72;
(Continued)

(56) References Cited

U.S. PATENT DOCUMENTS 6,717,057 B1    4/2004  Segall et al.
9,419,065 B2    8/2016  Degner et al.
(Continued)

FOREIGN PATENT DOCUMENTS

CN          1538910 A       10/2004
CN          104521331 A      4/2015
(Continued)

OTHER PUBLICATIONS

International Search Report for Application No. PCT/KR2019/016500 mailed on Mar. 5, 2020.
(Continued)

*Primary Examiner* — Philip C Tucker
*Assistant Examiner* — Brian R Slawski
(74) *Attorney, Agent, or Firm* — CANTOR COLBURN LLP

(57) ABSTRACT

A display device includes a display panel including a main display surface and a first sub-display surface that protrudes from one side of the main display surface, an adhesive layer disposed below the display panel, and a thermoforming film disposed below the adhesive layer, and the first sub-display surface may include a first top surface and a first side surface that defines a predetermined angle with the first top surface.

11 Claims, 13 Drawing Sheets

(51) Int. Cl.
  *B29C 51/26*  (2006.01)
  *B29C 51/42*  (2006.01)
  *B29K 67/00*  (2006.01)
  *B29K 105/00* (2006.01)
  *B29L 31/34*  (2006.01)

(52) U.S. Cl.
  CPC ........ *B29C 51/421* (2013.01); *B29K 2067/00* (2013.01); *B29K 2105/256* (2013.01); *B29L 2031/3475* (2013.01)

(58) Field of Classification Search
  CPC ... B29C 65/48; B29C 65/4815; B29C 66/524; B29C 66/5241; B29C 66/71; B29C 66/712; B29C 66/723; B29C 67/0011; B29C 67/0044; B29C 67/0048; B29K 2037/00; B29K 2105/256; B29L 2031/3475; G06F 1/16; G09F 9/30; H04M 1/02; H10K 2102/302; H10K 59/00; H10K 71/00; H10K 99/00
  USPC ......... 156/60, 196, 212, 216, 221, 222, 224, 156/250, 256, 332; 264/299, 313, 316, 264/319, 320, 331.11, 331.21, 339, 522; 345/173, 204; 445/24
  See application file for complete search history.

(56) References Cited

U.S. PATENT DOCUMENTS

| | | | |
|---|---|---|---|
| 9,981,417 B2 | 5/2018 | Park et al. | |
| 10,194,538 B2 | 1/2019 | Lee et al. | |
| 10,331,172 B2 | 6/2019 | Oh et al. | |
| 10,644,074 B2 | 5/2020 | Leng et al. | |
| 10,700,415 B2 | 6/2020 | Shin et al. | |
| 10,748,971 B2 | 8/2020 | An et al. | |
| 10,796,633 B2 | 10/2020 | Ahn et al. | |
| 2012/0168058 A1 | 7/2012 | Kim et al. | |
| 2013/0081756 A1* | 4/2013 | Franklin | G06F 1/16 264/479 |
| 2018/0164850 A1* | 6/2018 | Sim | G06F 1/1647 |
| 2019/0012007 A1* | 1/2019 | Kim | G06F 1/1626 |
| 2019/0343010 A1 | 11/2019 | Ji et al. | |
| 2020/0393870 A1 | 12/2020 | Sim et al. | |

FOREIGN PATENT DOCUMENTS

| | | |
|---|---|---|
| CN | 106095153 A | 11/2016 |
| CN | 106774689 A | 5/2017 |
| CN | 206210301 U | 5/2017 |
| CN | 106910823 A | 6/2017 |
| CN | 107665059 A | 2/2018 |
| CN | 108183980 A | 6/2018 |
| CN | 108370089 A | 8/2018 |
| CN | 109256479 A | 1/2019 |
| KR | 101179436 B1 | 9/2012 |
| KR | 1020150012593 A | 2/2015 |
| KR | 1020160028338 A | 3/2016 |
| KR | 1020170032251 A | 3/2017 |
| KR | 1020170094019 A | 8/2017 |
| KR | 1020180014384 A | 2/2018 |
| KR | 1020180014625 A | 2/2018 |
| KR | 101849656 B1 | 4/2018 |
| KR | 1020180065722 A | 6/2018 |
| KR | 101927801 B1 | 2/2019 |
| KR | 1020190126962 A | 11/2019 |

OTHER PUBLICATIONS

Written Opinion for Application No. PCT/KR2019/016500 mailed on Mar. 5, 2020.

* cited by examiner

FIG. 6
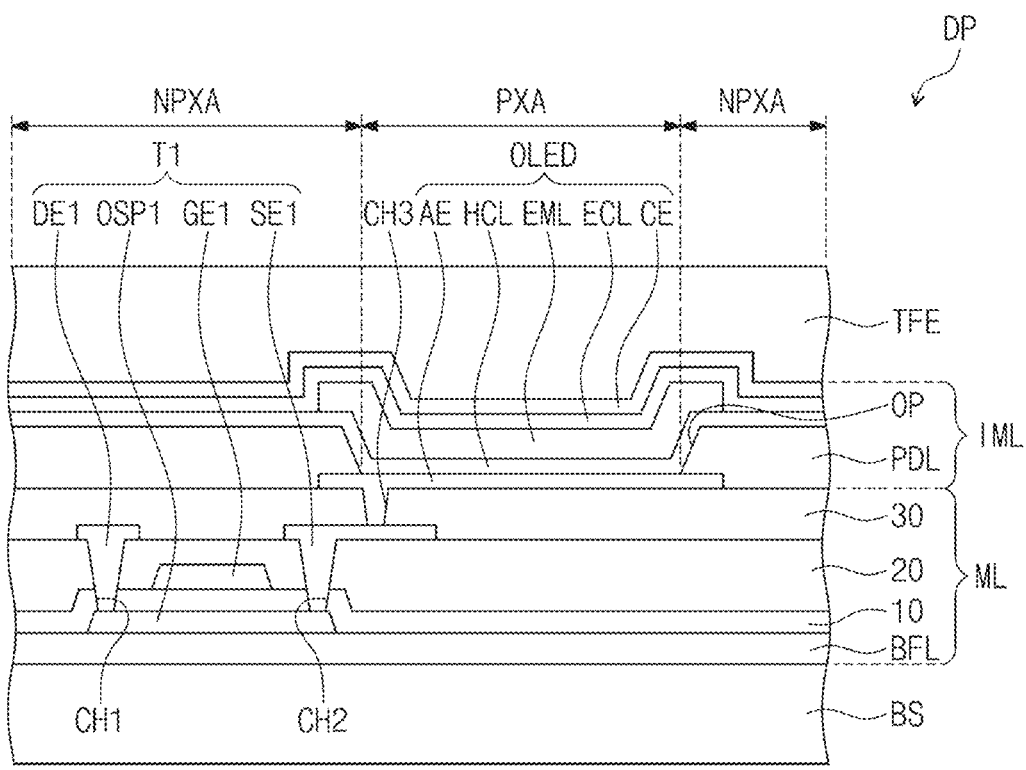
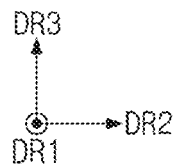

FIG. 10
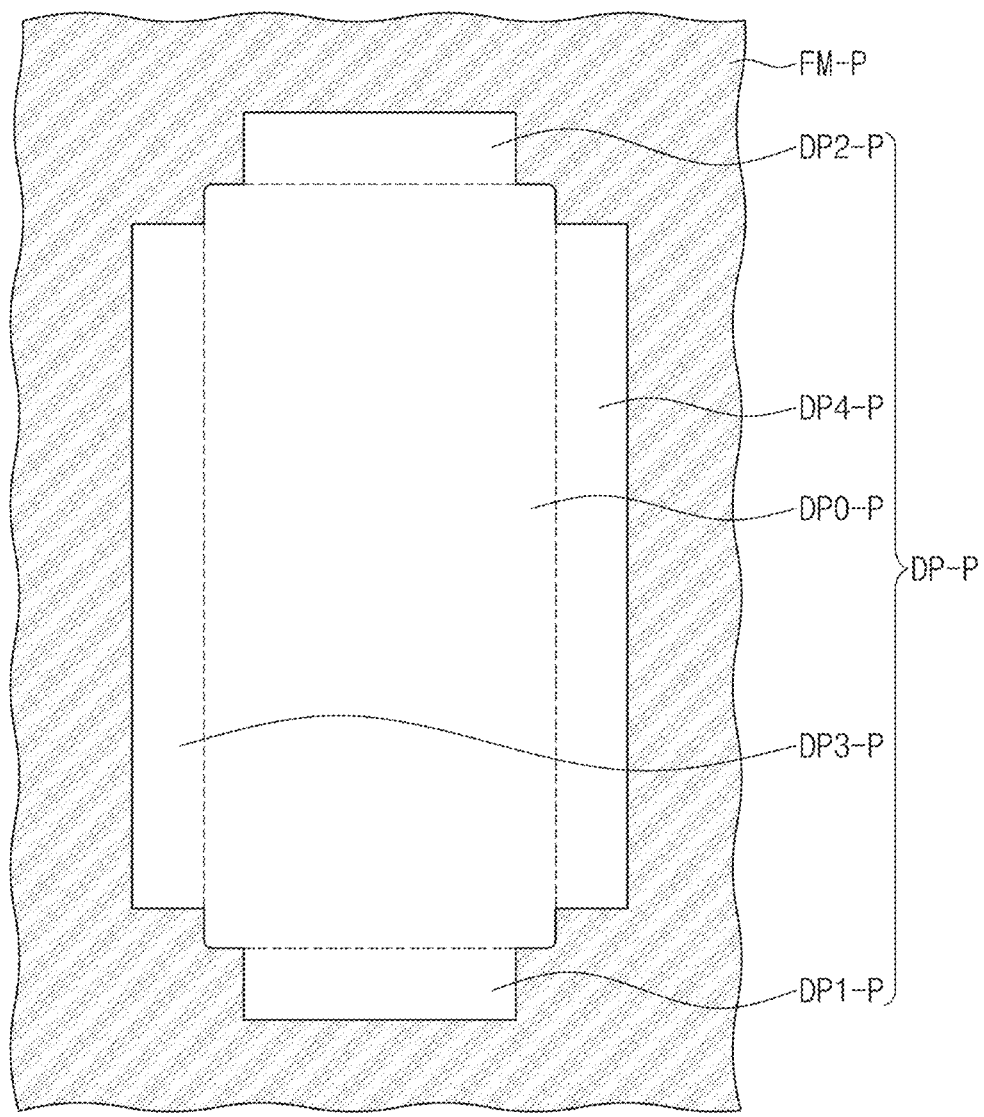
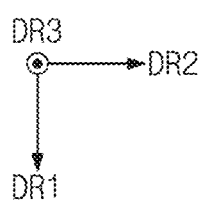

DISPLAY DEVICE AND DISPLAY DEVICE MANUFACTURING METHOD

This application is a national stage application of PCT/KR2019/016500, filed on Nov. 27, 2019, which claims priority to Korean Application No. 10-2019-0042419, filed on Apr. 11, 2019, the content of which in their entirety is herein incorporated by reference.

FIELD

Embodiments of the invention relate to a display device having improved reliability and a manufacturing method thereof.

DESCRIPTION OF THE RELATED ART

Various display devices that are used for multimedia devices such as a television, a mobile phone, a tablet computer, a navigation unit, and a game console are being developed. In recent years, a flexible display device is being developed to be portable and applied to various shaped devices, and a display device in which at least a portion is bent is being developed.

SUMMARY

In a process of manufacturing a display device, a limitation is generated such that a stress is applied to a portion of the display device to cause a damage.

Embodiments of the invention has an object to provide a display device having improved reliability and a manufacturing method thereof.

A display device in an embodiment of the invention may include a display panel including a main display surface and a first sub-display surface that protrudes from one side of the main display surface, an adhesive layer disposed below the display panel, and a thermoforming film disposed below the adhesive layer, and the first sub-display surface may include a first top surface and a first side surface that defines a predetermined angle with the first top surface.

In an embodiment, the main display surface and the first top surface may display an image in a first direction, and the first side surface may display an image in a second direction crossing the first direction.

In an embodiment, the main display surface may have a width greater than a width of the first sub-display surface.

In an embodiment, the display panel may further include a second sub-display surface, a third sub-display surface, and a fourth sub-display surface, the first sub-display surface and the second sub-display surface may be spaced apart from each other with the main display surface therebetween in a first direction, and the third sub-display surface and the fourth sub-display surface may be spaced apart from each other with the main display surface therebetween in a second direction crossing the first direction.

In an embodiment, the second sub-display surface may include a second top surface and a second side surface that defines a predetermined angle with the second top surface, the third sub-display surface may include a third top surface and a third side surface that defines a predetermined angle with the third top surface, and the fourth sub-display surface may include a fourth top surface and a fourth side surface that defines a predetermined angle with the fourth top surface. The first side surface may face the second side surface, and the third side surface may face the fourth side surface.

In an embodiment, the thermoforming film may include an amorphous polyester film.

In an embodiment, the thermoforming film may have a shape corresponding to a shape of the display panel.

In an embodiment, the thermoforming film may have a surface area greater than a surface area of the display panel in a plan view.

In an embodiment, the thermoforming film may include a first area that is overlapped with the display panel and a second area that is not overlapped with the display panel.

In an embodiment, at least one hole may be defined in the second area.

In an embodiment, the display device may further include a window disposed on the display panel and covering the display panel.

In an embodiment, the window may include a top window which covers the main display surface and the first top surface and a side window which covers the first side surface.

A method for manufacturing a display device in an embodiment of the invention may include fixing a preliminary thermoforming film onto a lower plate, boding a display panel onto the preliminary thermoforming film, allowing the lower plate to contact the preliminary thermoforming film, deforming shapes of the preliminary thermoforming film and the display panel by the lower plate, applying heat to the preliminary thermoforming film, and forming a thermoforming film by cutting a portion of the preliminary thermoforming film.

In an embodiment, the allowing of the lower plate to contact the preliminary thermoforming film may include vacuum-adsorbing the preliminary thermoforming film.

In an embodiment, the display panel may include a main display surface and a first sub-display surface that protrudes from one side of the main display surface, and the first sub-display surface may include a first top surface and a first side surface having a shape that is deformed by the lower plate.

In an embodiment, the deforming the shapes of the preliminary thermoforming film and the display panel by the lower plate and the applying the heat to the preliminary thermoforming film may be performed at a same time.

In an embodiment, the thermoforming film may include an amorphous polyester film.

In an embodiment, the thermoforming film may include a first area that is overlapped with the display panel and a second area that is not overlapped with the display panel, and the method may further include defining a hole in the second area.

In an embodiment, the method may further include bonding the display panel to a window.

In an embodiment, the preliminary thermoforming film may have a surface area greater than a surface area of the display panel in a plan view.

According to the invention, the display device may include the display panel and the thermoforming film. The display panel may include the top surface and the side surface bent at a predetermined angle with the top surface. As the thermoforming film is disposed on the display panel, the shape of the display panel may be easily deformed. The thermoforming film may relieve the stress generated when the shape of the display panel is deformed. The damage caused by the stress may not be generated in the display panel.

Thus, the display device having the improved reliability may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIG. 6 is a cross-sectional view of an embodiment of a display panel according to the invention.

FIG. 10 is a plan view illustrating an embodiment of the preliminary thermoforming film and the display panel according to the invention.

DETAILED DESCRIPTION

Figure 1:
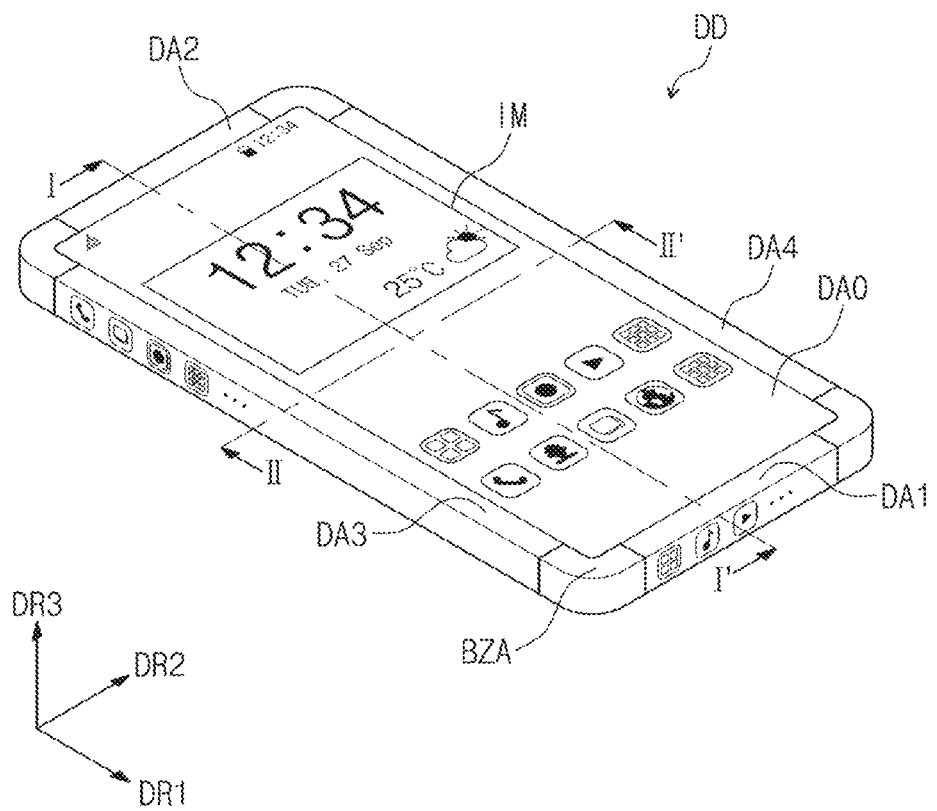
FIG. 1 is a perspective view of an embodiment of a display device according to the invention.

In this specification, it will be understood that when an element such as a region, layer, or portion is referred to as being "on" another element, it can be directly on the other element or intervening elements may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments of the invention will be described with reference to the accompanying drawings.

FIG. 1 is a perspective view of an embodiment of a display device according to the invention.

Referring to FIG. 1, a display device DD may include a flexible display device in this embodiment. However, the invention is not limited thereto. In an embodiment, the display device DD according to the invention may be a rigid display device DD, for example. The display device DD according to the invention may be used for large-sized electronic devices such as televisions and monitors and small and medium-sized electronic devices such as mobile phones, tablet computers, navigation units for vehicles, game consoles, and smart watches. In this embodiment, the display device DD is illustrated as a smartphone.

A display area may be defined on the display device DD. The display area may be defined as an area for displaying an image IM. The display area may include a main display area DA0 and first to fourth sub-display areas DA1, DA2, DA3, and DA4 protruding from the main display area DA0.

The main display area DA0 may be parallel to a surface defined by a first direction DR1 and a second direction DR2. A normal direction of the main display area DA0, i.e., a thickness direction of the display device DD, may indicate a third direction DR3.

The main display area DA0 may display the image IM through a front surface thereof. In an embodiment, the main display area DA0 may display the image IM in the third direction DR3, for example. The image IM may include a static image as well as a dynamic image. In FIG. 1, a clock window and icons are illustrated as an example of the image IM.

Here, directions indicated by the first to third directions DR1, DR2 and DR3, as relative concepts, may be converted with respect to each other. Hereinafter, first to third directions may be indicated by the first to third directions DR1, DR2, and DR3 and designated by the same reference numerals, respectively. Also, in this specification, a surface defined by the first direction DR1 and the second direction DR2 may be defined as a plane, and an expression "in the plan view" may be defined by a view in the third direction DR3.

The third direction DR3 may be a direction crossing each of the first direction DR1 and the second direction DR2. The first direction DR1, the second direction DR2, and the third direction DR3 may be perpendicular to each other.

Each of the first to fourth sub-display areas DA1, DA2, DA3, and DA4 may display the image IM through a top surface or a side surface thereof. In an embodiment, a portion of each of the first sub-display area DA1 and the second sub-display area DA2 may display the image IM in the first direction DR1, for example. A portion of each of the third sub-display area DA3 and the fourth sub-display area DA4 may display the image IM in the second direction DR2.

A bezel area BZA may be adjacent to the display area DA. The bezel area BZA may have a predetermined color. The display area may surround the bezel area BZA.

Figure 2:
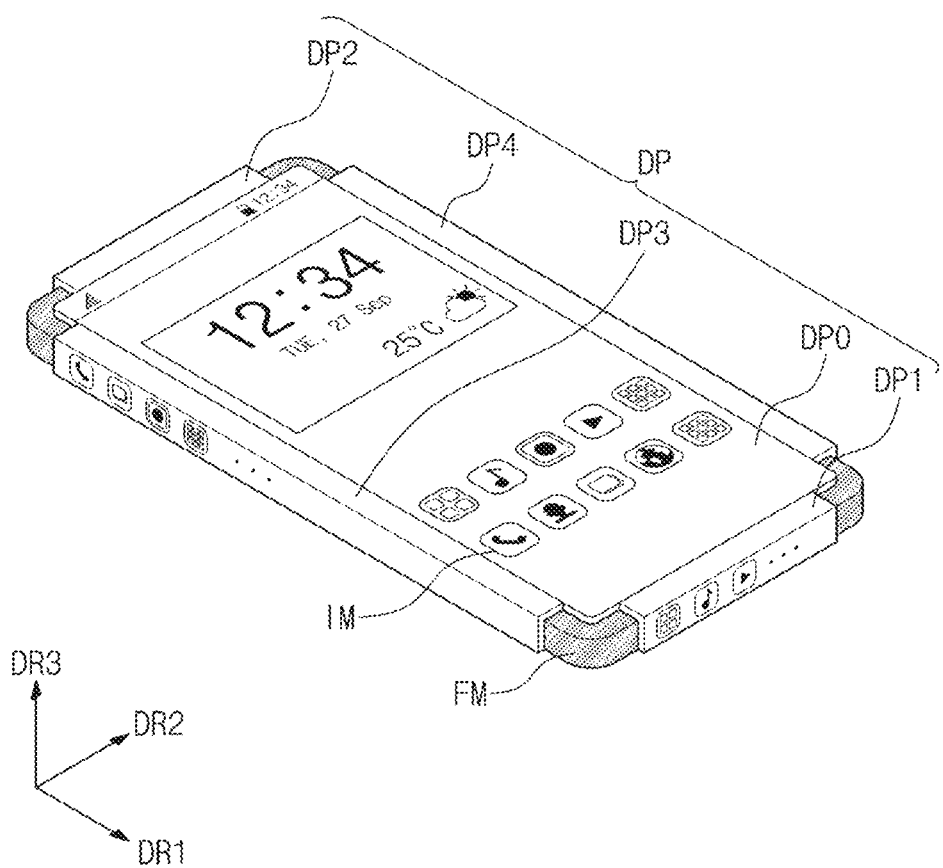
FIG. 2 is a perspective view illustrating an embodiment of a portion of components of the display device according to the invention.
Figure 3:
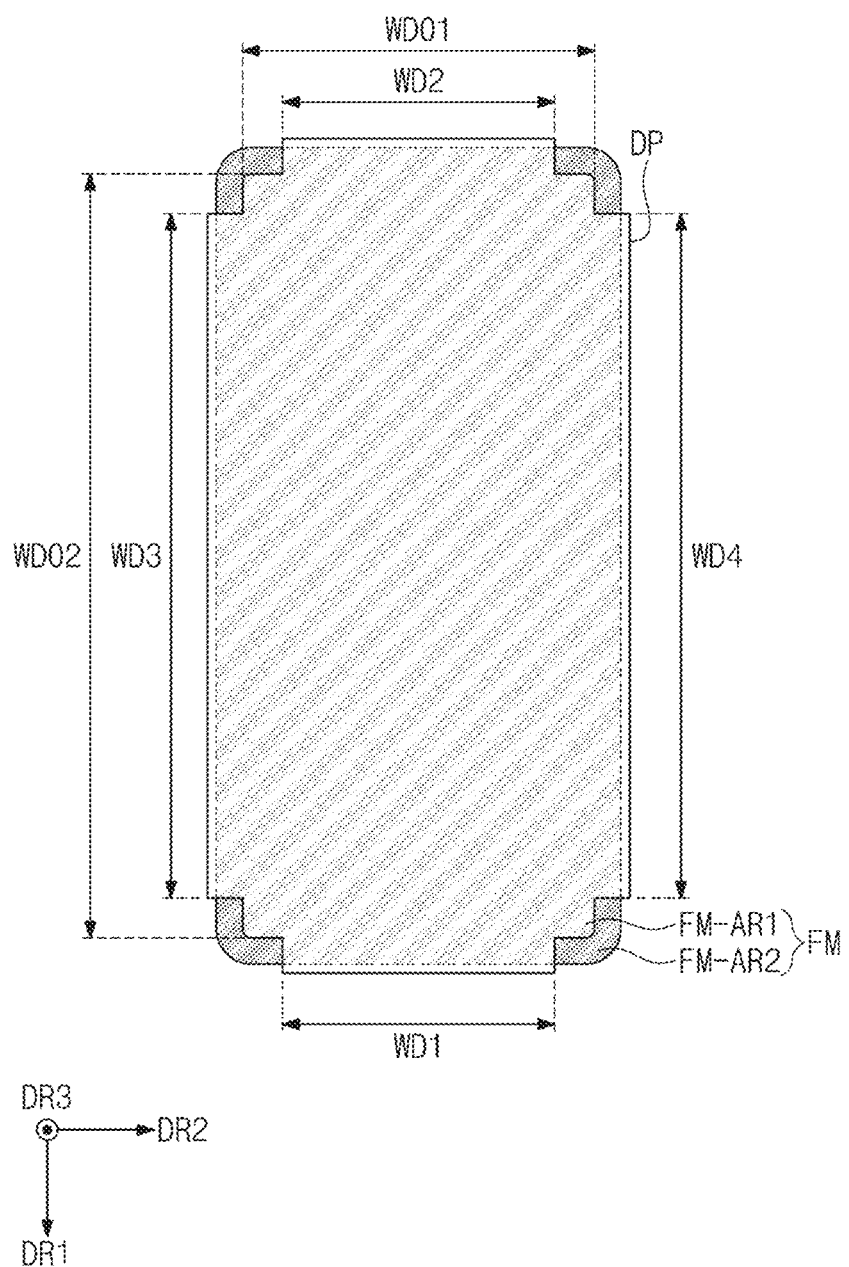
FIG. 3 is a transparent plan view illustrating an embodiment of a portion of components of the display device according to the invention.

FIG. 2 is a perspective view illustrating an embodiment of a portion of components of the display device according to the invention, and FIG. 3 is a transparent plan view illustrating an embodiment of a portion of components of the display device according to the invention.

Referring to FIGS. 2 and 3, the display device DD may include a display panel DP and a thermoforming film FM.

The display panel DP may include a main display surface DP0 and first to fourth sub-display surfaces DP1, DP2, DP3, and DP4. The main display surface DP0 may correspond to the main display area DA0. The first sub-display surface DP1 may correspond to the first sub-display area DA1. The second sub-display surface DP2 may correspond to the second sub-display area DA2. The third sub-display surface DP3 may correspond to the third sub-display area DA3. The fourth sub-display surface DP4 may correspond to the fourth sub-display area DA4.

A width WD01 of the main display surface DP0 in the second direction DR2 may be greater than a width WD1 of the first sub-display surface DP1 in the second direction DR2. The width WD01 of the main display surface DP0 in the second direction DR2 may be greater than a width WD2 of the second sub-display surface DP2 in the second direction DR2.

A width WD02 of the main display surface DP0 in the first direction DR1 may be greater than a width WD3 of the third sub-display surface DP3 in the first direction DR1. The width WD02 of the main display surface DP0 in the first direction DR1 may be greater than a width WD4 of the fourth sub-display surface DP4 in the first direction DR1.

The thermoforming film FM may have a surface area greater than that of the display panel DP in a plan view. The thermoforming film FM may include a first area FM-AR1 and a second area FM-AR2. The first area FM-AR1 may overlap the display panel DP. The second area FM-AR2 may not overlap the display panel DP. The first area FM-AR1 may be an area covered by the display panel DP, and the second area FM-AR2 may be an area that is not covered by the display panel DP. The second area FM-AR2 may be disposed at each of corners of the display device DD (refer to FIG. 1) in a plan view.

The first sub-display surface DP1 and the second sub-display surface DP2 may be spaced apart from each other with the main display surface DP0 therebetween in the first direction DR1. The third sub-display surface DP3 and the fourth sub-display surface DP4 may be spaced apart from each other with the main display surface DP0 therebetween in the second direction DR2.

Figure 4:
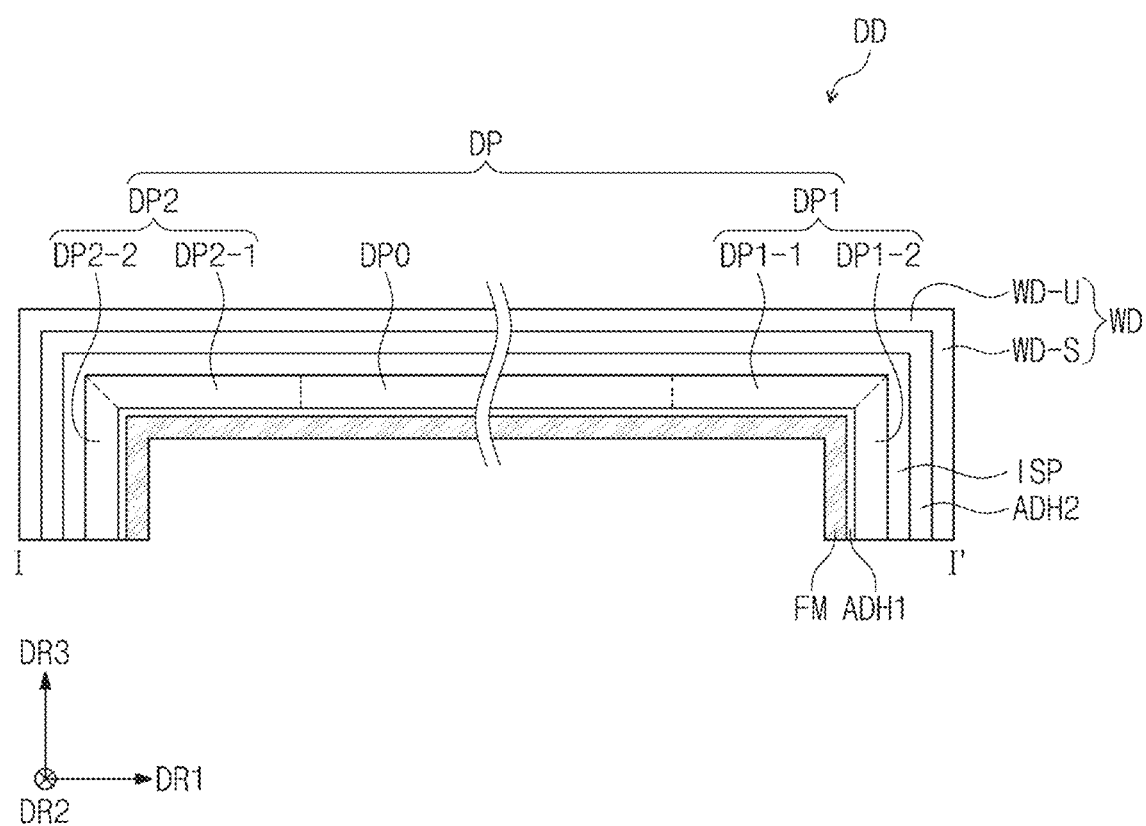
FIG. 4 is a cross-sectional view illustrating an embodiment of a portion of a cross-section taken along line I-I' of FIG. 1.
Figure 5:
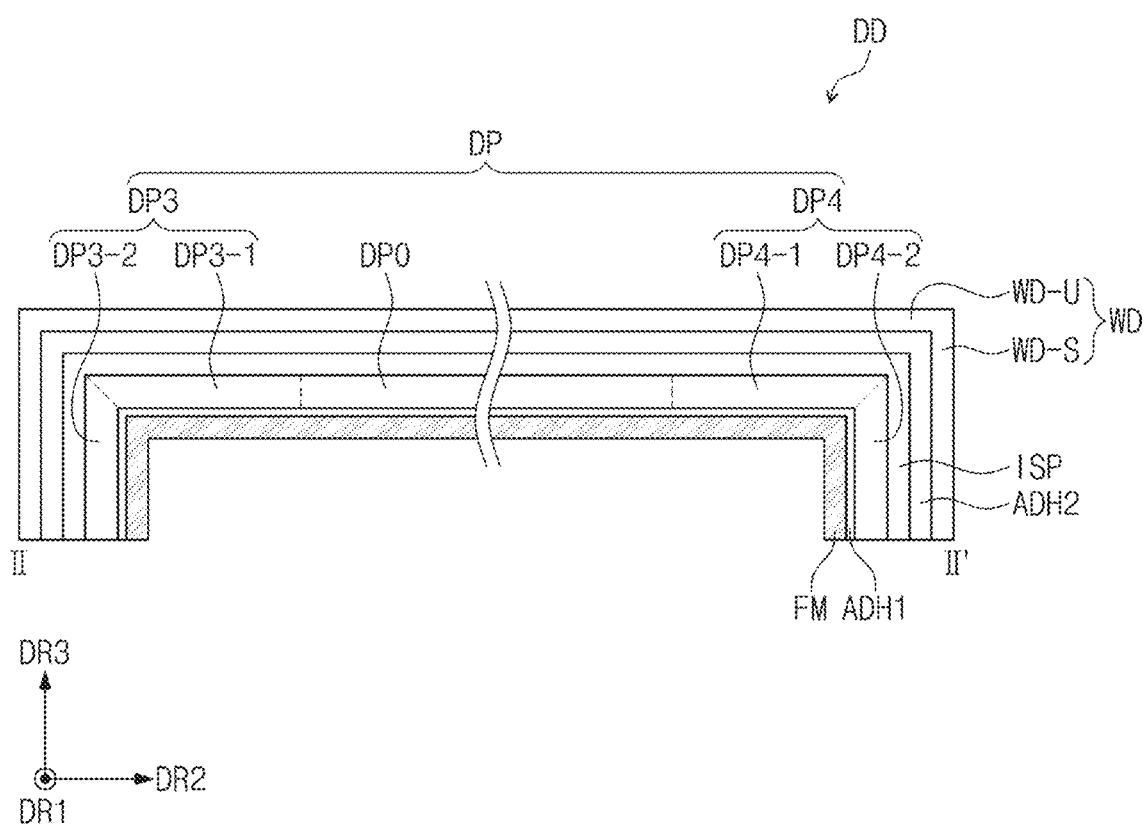
FIG. 5 is a cross-sectional view illustrating an embodiment of a portion of a cross-section taken along line II-IP of FIG. 1.

FIG. 4 is a cross-sectional view illustrating a portion of a cross-section taken along line I-I' of FIG. 1, and FIG. 5 is a cross-sectional view illustrating a portion of a cross-section taken along line II-IP of FIG. 1.

Referring to FIGS. 4 and 5, the display device DD may include a display panel DP, a thermoforming film FM, a first adhesive member (also referred to as a first adhesive layer) ADH1, an input sensing panel ISP, a second adhesive member (also referred to as a second adhesive layer) ADH2, and a window WD.

The display panel DP may include a light emitting display panel. In an embodiment, the light emitting display panel may be an organic light emitting display panel or a quantum dot light emitting display panel, for example. The organic light emitting display panel may include a light emitting layer including an organic light emitting material. The quantum dot light emitting display panel may include a light emitting layer including a quantum dot and a quantum rod. However, this is merely an example, and the display panel DP is not particularly limited to the invention. In an embodiment of the invention, the organic light emitting display panel is illustrated as an embodiment of the display panel DP.

The display panel DP may include a main display surface DP0, a first sub-display surface DP1, a second sub-display surface DP2, a third sub-display surface DP3, and a fourth sub-display surface DP4.

The main display surface DP0 may display the image IM in the third direction DR3. In an embodiment, the main display surface DP0 may display the image IM in the thickness direction of the display device DD, for example.

The first sub-display surface DP1 may protrude from one side of the main display surface DP0 in the first direction DR1. The first sub-display surface DP1 may include a first top surface DP1-1 and a first side surface DP1-2. The first top surface DP1-1 may display the image IM in the thickness direction DR3 of the display panel DP. The first side surface DP1-2 may display the image IM in a direction crossing the thickness direction DR3 of the display device DD. In an embodiment, when an angle between the first top surface DP1-1 and the first side surface DP1-2 is 90 degrees)(°, the crossing direction may be the first direction DR1, for example.

The second sub-display surface DP2 may protrude from one side of the main display surface DP0 in the first direction DR1. The second sub-display surface DP2 may include a second top surface DP2-1 and a second side surface DP2-2. The second top surface DP2-1 may display the image IM in the third direction DR3. The second side surface DP2-2 may display the image IM in the third direction DR3. In an embodiment, when an angle between the second top surface DP2-1 and the second side surface DP2-2 is 90°, the crossing direction may be the first direction DR1, for example. The first side surface DP1-2 and the second side surface DP2-2 may face each other.

The third sub-display surface DP3 may protrude from one side of the main display surface DP0 in the second direction DR2. The third sub-display surface DP3 may include a third top surface DP3-1 and a third side surface DP3-2. The third top surface DP3-1 may display the image IM in the third direction DR3. The third side surface DP3-2 may display the image IM in the direction crossing the third direction DR3. In an embodiment, when an angle between the third top surface DP3-1 and the third side surface DP3-2 is 90°, the crossing direction may be the second direction DR2, for example.

The fourth sub-display surface DP4 may protrude from one side of the main display surface DP0 in the second direction DR2. The fourth sub-display surface DP4 may include a fourth top surface DP4-1 and a fourth side surface DP4-2. The fourth top surface DP4-1 may display the image IM in the third direction DR3. The fourth side surface DP4-2 may display the image IM in the direction crossing the third direction DR3. In an embodiment, when an angle between the fourth top surface DP4-1 and the fourth side surface DP4-2 is 90°, the crossing direction may be the second direction DR2, for example. The third side surface DP3-2 and the fourth side surface DP4-2 may face each other.

The thermoforming film FM may be disposed below the display panel DP. The thermoforming film FM may include an amorphous polyester ("A-PET") film. However, this is merely an example, and the thermoforming film FM may include various films in the invention.

In an embodiment of the invention, the thermoforming film FM may be disposed below the display panel DP and allow a shape of the display panel DP to be easily deformed. When the first to fourth side surfaces DP1-2, DP2-2, DP3-2, and DP4-2 are formed or provided, the thermoforming film FM may fix shapes thereof. The thermoforming film FM may relieve a stress generated when the shape of the display panel DP is deformed. A damage caused by the stress may not be generated in the display panel DP. Thus, the display device DD having improved reliability may be provided.

A first adhesive member ADH1 may be disposed between the display panel DP and the thermoforming film FM. The first adhesive member ADH1 may couple the display panel DP with the thermoforming film FM. In an embodiment, the first adhesive member ADH1 may include an optically clear adhesive OCA including an acrylic-based material, for example. However, this is merely an example, and the first adhesive member ADH1 may include various materials in the invention.

The input sensing panel ISP may be disposed on the display panel DP. The input sensing panel ISP may be directly disposed on the display panel DP or coupled with the display panel DP by the adhesive member.

The input sensing panel ISP in an embodiment of the invention may sense variation of a capacitance, which is caused by an external object. This may be also referred to as a capacitive input sensing panel. The input sensing panel ISP in an embodiment of the invention may sense variation of a pressure, which is caused by an external object, to sense an external input. This may be also referred to as a pressure sensitive input sensing panel.

The second adhesive member ADH2 may be disposed between the window WD and the input sensing panel ISP. The second adhesive member ADH2 may couple the window WD with the input sensing panel ISP. The second adhesive member ADH2 may include substantially the same material as that of the first adhesive member ADH1.

The window WD may be disposed on the second adhesive member ADH2. The window WD may cover the display panel DP. The window WD may the same shape as that of the display panel DP. The window WD may protect the display panel DP against an external impact and provide an input surface to a user. The window WD may include glass or plastic. The window WD may have a transparent property so that light generated from the display panel DP is transmitted therethrough. In an embodiment of the invention, the window WD may be omitted.

The window WD may include a top window WD-U and a side window WD-S bent from the top window WD-U. The top window WD-U may cover the main display surface DP0 and the first to fourth top surfaces DP1-1, DP2-1, DP3-1, and DP4-1. The side window WD-S may cover the first to fourth side surfaces DP1-2, DP2-2, DP3-2, and DP4-2.

Unlike the embodiment of the invention, when the display panel DP and the window WD are coupled while deforming a shape of the display panel DP and a shape of the window WD, bubbles may be generated because a portion of the display panel DP is not coupled to the window WD. In an embodiment of the invention, the display panel DP having a shape deformed in correspondence to a shape of the window WD may be coupled with the window WD. Sweep may not be generated on the display panel DP when the display panel DP is coupled with the window WD. Thus, a damage caused by the sweep may not be generated on the display panel DP. Also, as the window WD and the display panel DP, which have the same shape as each other, are uniformly bonded, bubbles may not be generated between the window WD and the display panel DP. Thus, the display device DD having improved reliability may be provided.

FIG. 6 is a cross-sectional view of an embodiment of the display panel according to the invention.

Referring to FIG. 6, the display panel DP may include a base layer BS, a circuit element layer ML, a display element layer IML, and a thin-film encapsulation layer TFE. The circuit element layer ML, the display element layer IML, and the thin-film encapsulation layer TFE may be sequentially arranged on the base layer BS.

The base layer BS may include a synthetic resin film. A synthetic resin layer may be provided on a working substrate when the display panel DP is manufactured. Thereafter, a conductive layer, an insulation layer, and the like may be provided on the synthetic resin layer. When the working substrate is removed, the synthetic resin layer may correspond to the base layer BS. The synthetic resin layer may include a thermosetting resin. Particularly, the synthetic resin layer may be a polyimide-based resin layer, and the invention is not particularly limited to the material of the synthetic resin layer. Besides, the base layer BS may include an organic/inorganic composite substrate.

In this embodiment, the circuit element layer ML may include a buffer layer BFL, a first intermediate inorganic layer 10, and a second intermediate inorganic layer 20, which are inorganic layers, and an intermediate organic layer 30 that is an organic layer. The invention is not particularly limited to the material of each of the inorganic layer and the organic layer, and the buffer layer BFL may be selectively provided or omitted in an embodiment of the invention.

A semiconductor pattern OSP1 of a transistor T1 may be disposed on the buffer layer BFL. The semiconductor pattern OSP1 may be selected from amorphous silicon, polysilicon, or a metal oxide semiconductor.

The first intermediate inorganic layer 10 may be disposed on the semiconductor pattern OSP1. A control electrode GE1 of the transistor T1 may be disposed on the first intermediate inorganic layer 10.

The second intermediate inorganic layer (also referred to as a second insulation layer) 20 for covering the control electrode GE1 may be disposed on the first intermediate inorganic layer (also referred to as a first insulation layer) 10. An input electrode DE1 and an output electrode SE1 of the transistor T1 may be disposed on the second intermediate inorganic layer 20.

The input electrode DE1 and the output electrode SE1 may be connected to the semiconductor pattern OSP1 through first and second through-holes CH1 and CH2 passing through the first and second insulation layers 10 and 20, respectively. In an alternative embodiment, in another embodiment of the invention, the transistor T1 may be deformed into a bottom gate structure.

The intermediate organic layer 30 for covering the input electrode DE1 and the output electrode SE1 may be disposed on the second intermediate inorganic layer 20. The intermediate organic layer 30 may provide a flat surface.

The display element layer IML may be disposed on the intermediate organic layer 30. The display element layer IML may include a pixel defining layer PDL and an organic light emitting diode OLED. The pixel defining layer PDL may include an organic material. A first electrode AE may be disposed on the intermediate organic layer 30. The first electrode AE may be connected to the output electrode SE1 through a third through-hole CH3 passing through the intermediate organic layer 30. An opening OP may be defined in the pixel defining layer PDL. The opening OP may expose at least a portion of the first electrode AE. In an embodiment of the invention, the pixel defining layer PDL may be omitted.

In an embodiment of the invention, a light emitting area PXA may overlap the transistor T1.

A hole control layer HCL may be disposed on the light emitting area PXA and a non-light emitting area NPXA in common. A light emitting layer EML may be disposed on the hole control layer HCL. The light emitting layer EML may be disposed in an area corresponding to the opening OP The light emitting layer EML may include an organic material and/or an inorganic material. The light emitting layer EML may generate colored light having a predetermined color.

An electron control layer ECL may be disposed on the light emitting layer EML. A second electrode CE may be disposed on the electronic control layer ECL.

The thin-film encapsulation layer TFE may be disposed on the second electrode CE. The thin-film encapsulation layer TFE may cover the second electrode CE. A capping layer for covering the second electrode CE may be further disposed between the thin-film encapsulation layer TFE and the second electrode CE. Here, the thin-film encapsulation layer TFE may directly cover the capping layer.

Figure 7:
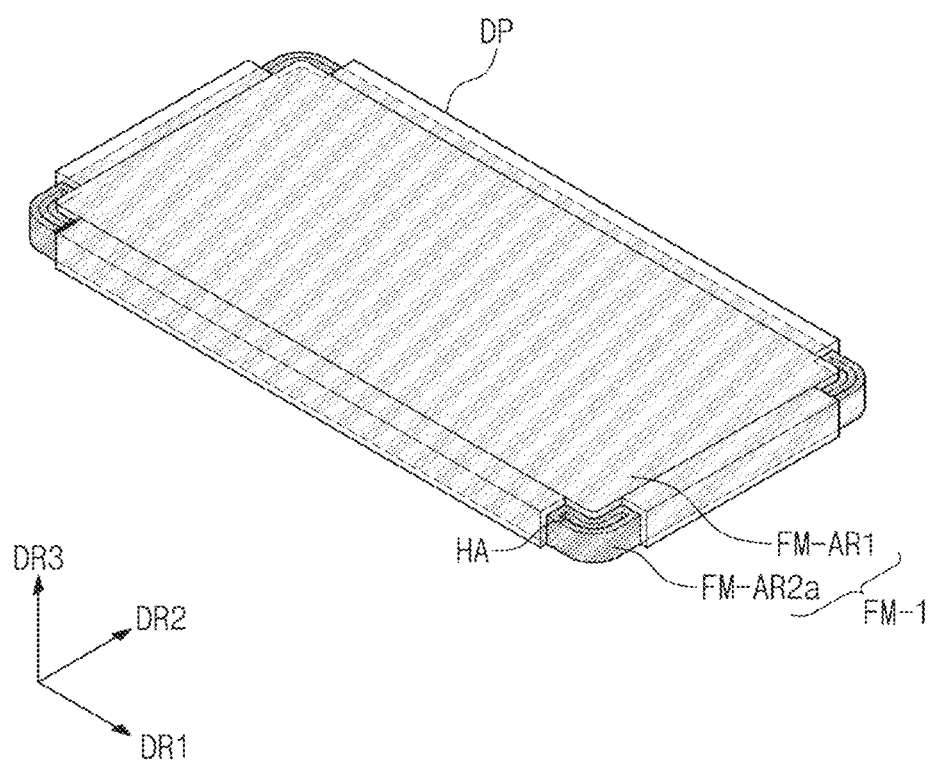
FIG. 7 is a transparent perspective view illustrating an embodiment of a portion of the display device according to the invention.

FIG. 7 is a transparent perspective view illustrating an embodiment of a portion of the display device according to the invention. The components described in FIGS. 2 and 3 will be designated by the same reference symbols, and description thereof will be omitted.

Referring to FIG. 7, a thermoforming film FM-1 may include a first area FM-AR1 and a second area FM-AR2a.

The second area FM-AR2a may not overlap the display panel DP in a plan view. In an embodiment, the second area FM-AR2a may be disposed at each of corners of the display device DD (refer to FIG. 1) in the plan view, for example.

At least one hole HA may be defined in the second area FM-AR2a. An electronic component (not shown) may be disposed below the hole HA. Since a portion of the thermoforming film FM-1 of an area corresponding to the electronic component is removed, sensing sensitivity of the electronic component may improve. Also, when the electronic component is accommodated in the hole HA, the thin-type display device DD (refer to FIG. 1) may be realized.

The electronic component may include various functional modules for operating the display device DD (refer to FIG. 1). The electronic component may receive an external input transmitted through the hole HA or provide an output through the hole HA. In an embodiment, the electronic component may include a camera, a proximity sensor, and an infrared sensor, for example. Also, the electronic component in an embodiment of the invention may include various embodiments and may not be limited to any one particular embodiment.

Figure 8:
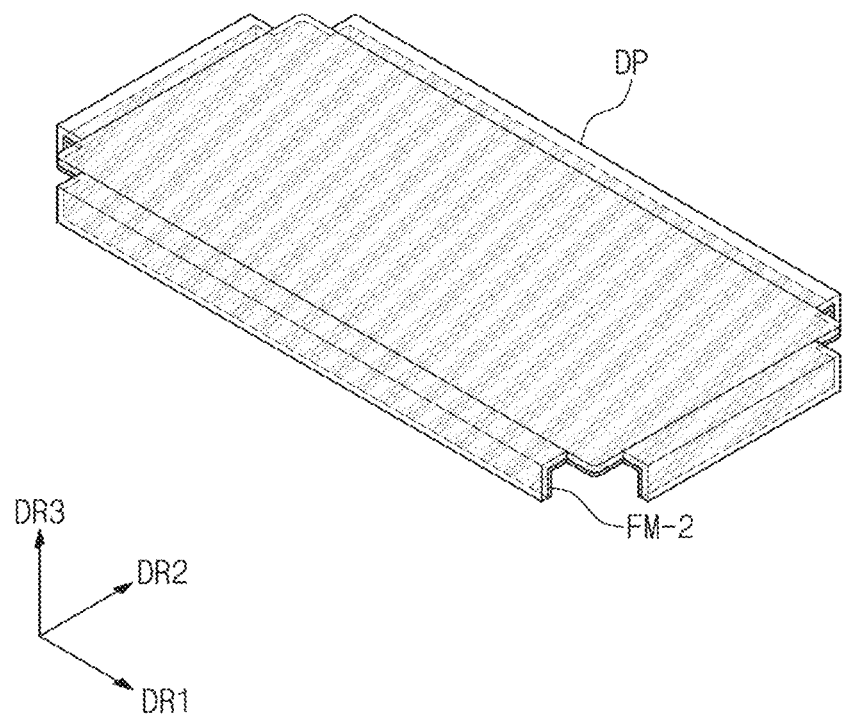
FIG. 8 is a transparent perspective view illustrating an embodiment of a portion of the display device according to the invention.

FIG. 8 is a transparent perspective view illustrating an embodiment of a portion of the display device according to the invention. The components described in FIGS. 2 and 3 will be designated by the same reference symbols, and description thereof will be omitted.

Referring to FIG. 8, a thermoforming film FM-2 may correspond to the shape of the display panel DP. The thermoforming film FM-2 may overlap the display panel DP in a plan view. The bezel area BZA (refer to FIG. 1) may not overlap the thermoforming film FM-2. The electronic component may be disposed in the bezel area BZA (refer to FIG. 1).

Figure 9:
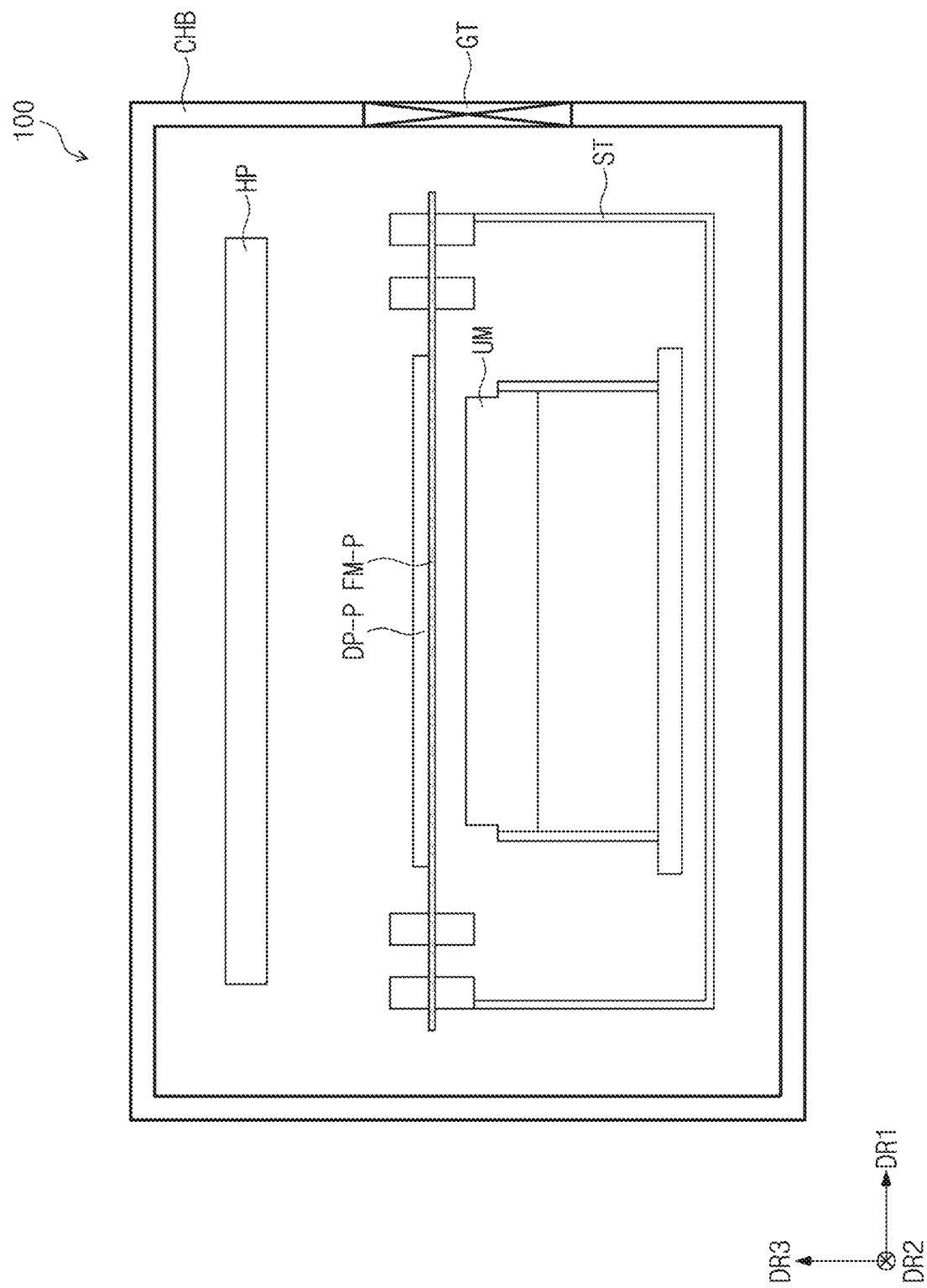
FIG. 9 is a cross-sectional view illustrating an embodiment of a process of fixing a preliminary thermoforming film onto a lower plate according to the invention.

FIG. 9 is a cross-sectional view illustrating an embodiment of a process of fixing a preliminary thermoforming film onto a lower plate according to the invention, and FIG. 10 is a plan view illustrating an embodiment of the preliminary thermoforming film and the display panel according to the invention.

Referring to FIGS. 9 and 10, a manufacturing device 100 may include a chamber CHB, a gate GT, a thermal plate HP, a stage ST, and a lower plate UM.

The thermal plate HP, the stage ST, and the lower plate UM may be disposed in the chamber CHB.

The chamber CHB may provide a closed space. The chamber CHB may include at least one gate GT. The chamber CHB may be opened and closed through the gate GT. A preliminary thermoforming film FM-P and a display panel DP-P before being deformed may be loaded and unloaded through the gate GT of the chamber CHB.

The thermal plate HP may be disposed at an upper portion in the chamber CHB.

The stage ST may be disposed at a lower portion in the chamber CHB. The stage ST may fix the preliminary thermoforming film FM-P.

In an embodiment, the preliminary thermoforming film FM-P may have a thickness equal to or greater than about 50 micrometers (μm) and less than about 300 μm so that the preliminary thermoforming film FM-P is easily deformed and cured by heat.

The lower plate UM may be disposed in the stage ST. The lower plate UM may be disposed below the preliminary thermoforming film FM-P.

The display panel DP-P before being deformed may be disposed on the preliminary thermoforming film FM-P. The first adhesive member ADH1 (refer to FIG. 4) may be disposed between the display panel DP-P before being deformed and the preliminary thermoforming film FM-P.

The display panel DP-P before being deformed may include a main display surface DP0-P and first to fourth sub-display surfaces DP1-P, DP2-P, DP3-P, and DP4-P.

The first sub-display surface DP1-P may protrude from the main display surface DP0-P in the first direction DR1. The second sub-display surface DP2-P may protrude from the main display surface DP0-P in the first direction DR1. The first sub-display surface DP1-P and the second sub-display surface DP2-P may be spaced apart from each other with the main display surface DP0-P therebetween in the first direction DR1.

The third sub-display surface DP3-P may protrude from the main display surface DP0-P in the second direction DR2. The fourth sub-display surface DP4-P may protrude from the main display surface DP0-P in the second direction DR2. The third sub-display surface DP3-P and the fourth sub-display surface DP4-P may be spaced apart from each other with the main display surface DP0-P therebetween in the second direction DR2.

The preliminary thermoforming film FM-P may have a surface area greater than that of the display panel DP-P before being deformed in a plan view.

Figure 11:
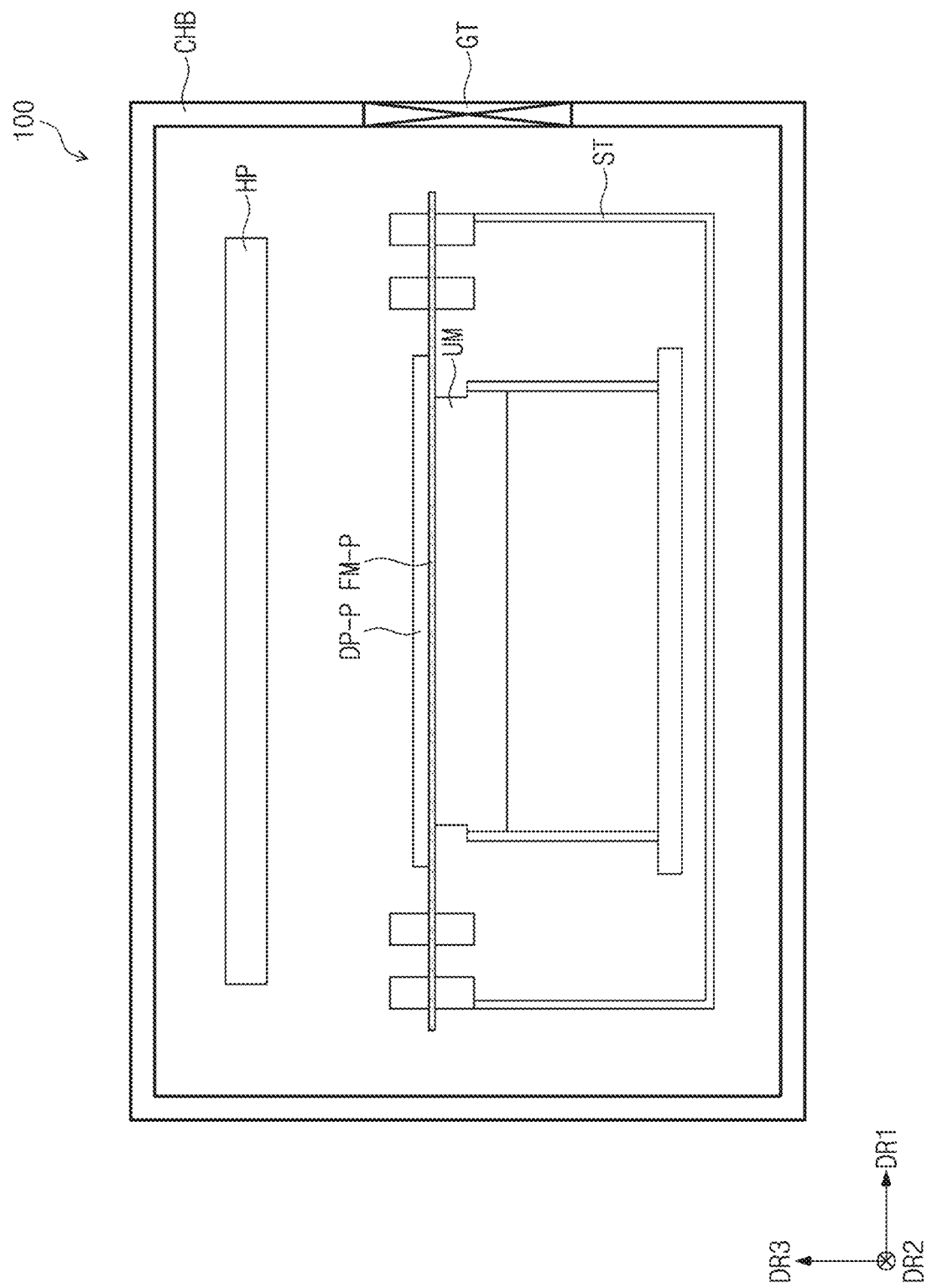
FIG. 11 is a cross-sectional view illustrating an embodiment of a process of allowing the lower plate and the preliminary thermoforming film to contact each other according to the invention.

FIG. 11 is a cross-sectional view illustrating an embodiment of a process of allowing the lower plate and the preliminary thermoforming film to contact each other according to the invention. The components described in FIGS. 9 and 10 will be designated by the same reference symbols, and description thereof will be omitted.

Referring to FIG. 11, the lower plate UM and the preliminary thermoforming film FM-P may contact each other. The inside of the stage ST may be in a vacuum state. The lower plate UM may vacuum-adsorb the preliminary thermoforming film FM-P.

Figure 12:
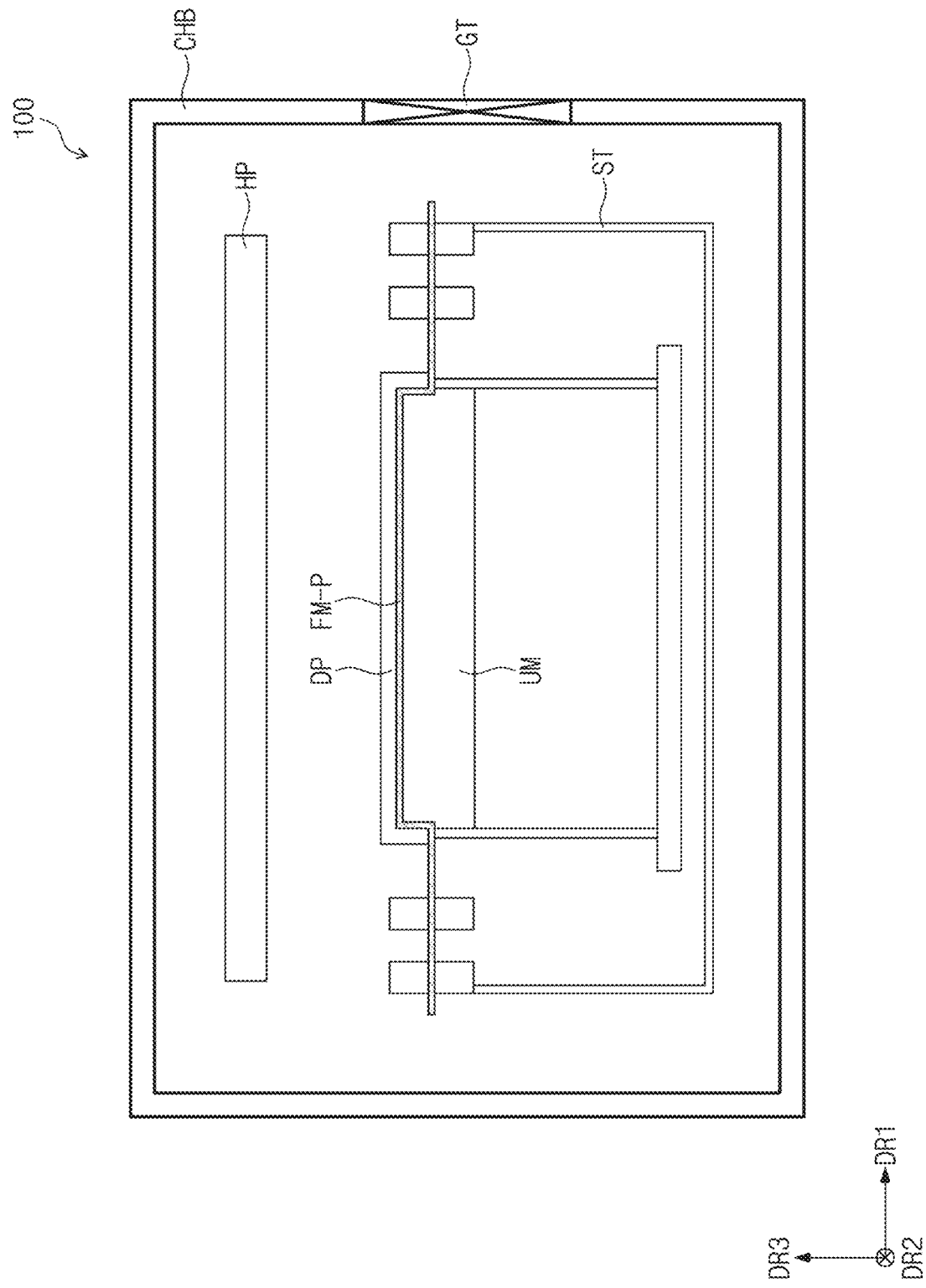
FIG. 12 is a cross-sectional view illustrating an embodiment of a process of deforming shapes of the preliminary thermoforming film and the display panel by the lower plate according to the invention.

FIG. 12 is a cross-sectional view illustrating an embodiment of a process of deforming shapes of the preliminary thermoforming film and the display panel by the lower plate according to the invention. The components described in FIGS. 9 and 11 will be designated by the same reference symbols, and description thereof will be omitted.

Referring to FIG. 12, the lower plate UM may ascend in the third direction DR3 in a state in which the lower plate UM is vacuum-adsorbed with the preliminary thermoforming film FM-P. The display panel DP-P before being deformed may be deformed into the display panel DP by the lower plate UM. The display panel DP may have the same shape as that of the lower plate UM.

In an embodiment of the invention, as the shape of the display panel DP is deformed in a state of being coupled with the preliminary thermoforming film FM-P that is vacuum-adsorbed, a double curvature may not be generated. A crack caused by the double curvature may be prevented from being generated in the display panel DP. Thus, the display device DD (refer to FIG. 1) having improved reliability may be provided.

The thermal plate HP may provide heat to the preliminary thermoforming film FM-P. The process of deforming the shapes of the preliminary thermoforming film FM-P and the display panel DP by the lower plate UM and the process of applying heat to the preliminary thermoforming film FM-P may be performed at the same time.

The preliminary thermoforming film FM-P may be cured as the heat is cooled. The shape of the display panel DP may be maintained by the preliminary thermoforming film FM-P.

Figure 13:
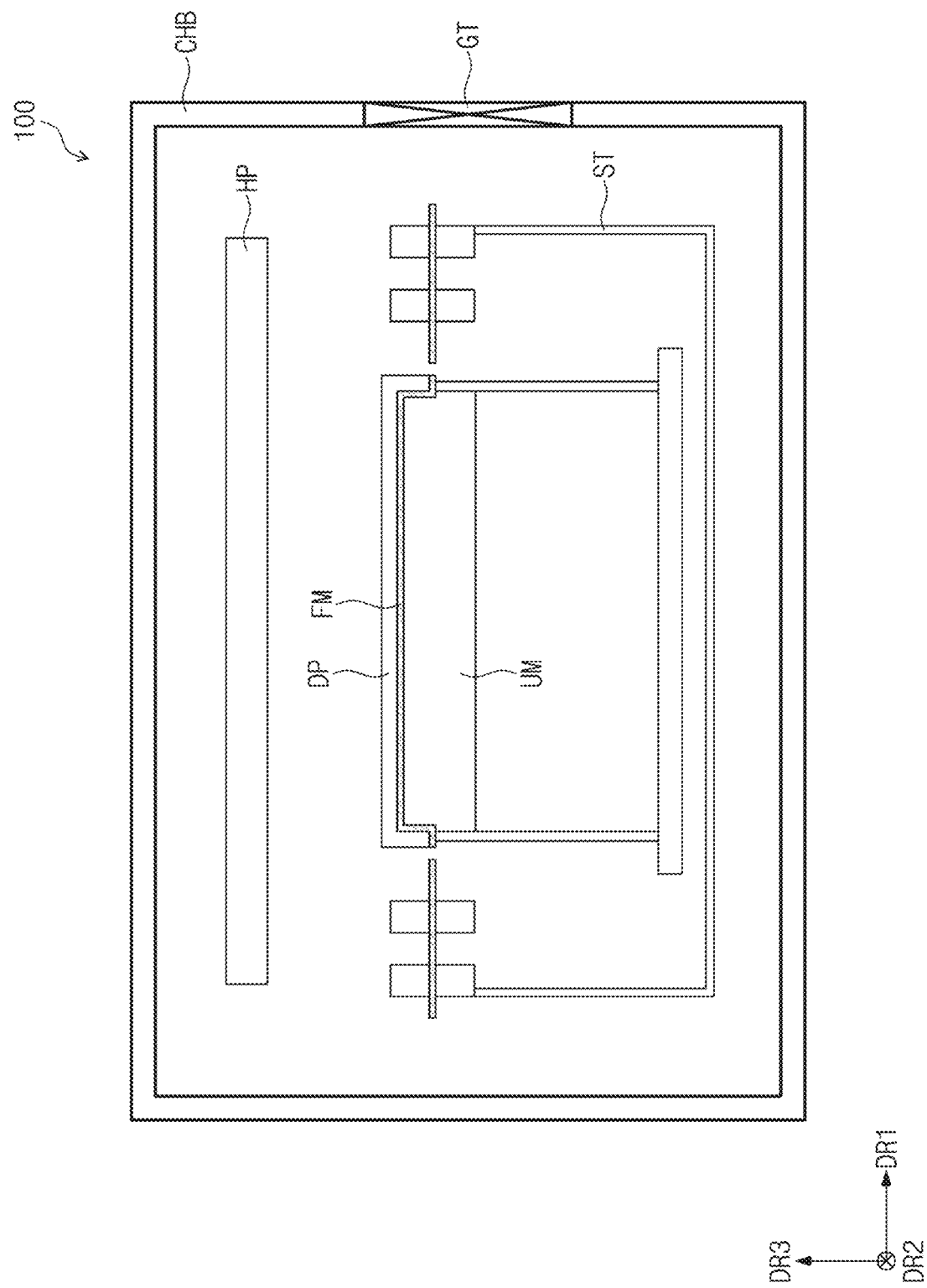
FIG. 13 is a cross-sectional view illustrating an embodiment of a process of forming a preliminary thermoforming film by cutting a portion of the preliminary thermoforming film according to the invention.

FIG. 13 is a cross-sectional view illustrating an embodiment of a process of forming the thermoforming film by cutting a portion of the preliminary thermoforming film according to the invention.

Referring to FIG. 13, the thermoforming film FM may be formed or provided by cutting a portion of the preliminary thermoforming film FM-P. The thermoforming film FM and the display panel DP may constitute the display device DD (refer to FIG. 1).

In an embodiment of the invention, the display panel DP may have a shape that is easily coupled with the window WD (refer to FIG. 4). Sweep may not be generated on the display panel DP when the display panel DP is coupled with the window WD (refer to FIG. 4). Thus, a damage caused by the sweep may not be generated on the display panel DP. Also, since the display panel DP is coupled to the window WD (refer to FIG. 4) with the same shape, bubbles may not be generated between the display panel DP and the window WD. Thus, the display device DD (refer to FIG. 1) having improved reliability may be provided.

It will be apparent to those skilled in the art that various modifications and variations may be made in the invention. Thus, it is intended that the invention covers the modifications and variations of this invention provided they come within the scope of the appended claims and their equivalents. Hence, the real protective scope of the invention shall be determined by the technical scope of the accompanying claims.

Reliability of a display device may improve by relieving a stress of a bent portion in a display device of which at least a portion is bent. Thus, the invention related to the display device has high industrial applicability.

The invention claimed is:

1. A display device comprising:
    a display panel comprising a main display surface and a first sub-display surface which protrudes from one side of the main display surface;
    an adhesive layer disposed below the display panel; and
    a thermoforming film disposed below the adhesive layer,
    wherein the first sub-display surface comprises a first top surface and a first side surface which defines a predetermined angle with the first top surface, and
    the main display surface has a width greater than a width of the first sub-display surface in a predetermined direction perpendicular to an arrangement direction along which the main display surface and the first sub-display surface are arranged in a plan view.

2. The display device of claim 1, wherein the main display surface and the first top surface display an image in a first direction, and the first side surface displays an image in a second direction crossing the first direction.

3. The display device of claim 1, wherein the display panel further comprises a second sub-display surface, a third sub-display surface, and a fourth sub-display surface,
    the first sub-display surface and the second sub-display surface are spaced apart from each other with the main display surface therebetween in a first direction, and
    the third sub-display surface and the fourth sub-display surface are spaced apart from each other with the main display surface therebetween in a second direction crossing the first direction.

4. The display device of claim 3, wherein the second sub-display surface comprises a second top surface and a second side surface which defines a predetermined angle with the second top surface,
    the third sub-display surface comprises a third top surface and a third side surface which defines a predetermined angle with the third top surface, and
    the fourth sub-display surface comprises a fourth top surface and a fourth side surface which defines a predetermined angle with the fourth top surface,
    wherein the first side surface faces the second side surface, and the third side surface faces the fourth side surface.

5. The display device of claim 1, wherein the thermoforming film comprises an amorphous polyester film.

6. The display device of claim 1, wherein the thermoforming film has a shape corresponding to a shape of the display panel.

7. The display device of claim 1, wherein the thermoforming film has a surface area greater than a surface area of the display panel in the plan view.

8. The display device of claim 1, wherein the thermoforming film comprises a first area which is overlapped with the display panel and a second area which is not overlapped with the display panel.

9. The display device of claim 8, wherein at least one hole is defined in the second area.

10. The display device of claim 1, further comprising a window disposed on the display panel and covering the display panel.

11. The display device of claim 10, wherein the window comprises a top window which covers the main display surface and the first top surface and a side window which covers the first side surface.

* * * * *